(12) United States Patent
Uehara et al.

(10) Patent No.: US 6,304,508 B1
(45) Date of Patent: Oct. 16, 2001

(54) SEMICONDUCTOR DEVICE

(75) Inventors: Hidenori Uehara; Nobutaka Nasu, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/519,573

(22) Filed: Mar. 6, 2000

(30) Foreign Application Priority Data

Apr. 9, 1999 (JP) .................................................. 11-102605

(51) Int. Cl.[7] ........................................................ G11C 7/00
(52) U.S. Cl. ...................................... 365/226; 365/189.09
(58) Field of Search .............................. 365/226, 189.09, 365/203, 230.03, 230.06

(56) References Cited

U.S. PATENT DOCUMENTS

| | | | |
|---|---|---|---|
| 5,510,749 | * 4/1996 | Arimoto | 327/546 |
| 5,805,508 | * 9/1998 | Tobita | 365/189.09 |
| 5,905,679 | * 5/1999 | Tsukikawa | 365/189.06 |
| 6,031,779 | * 2/2000 | Takahashi et al. | 365/226 |

* cited by examiner

Primary Examiner—Amir Zarabian
Assistant Examiner—Anh Phung
(74) Attorney, Agent, or Firm—Jones Volentine, PLLC (57) ABSTRACT

A semiconductor device includes an internal source voltage generating circuit (debooster circuit) provided between an external source voltage $EV_{CC}$ and a ground voltage $V_{SS}$ and for generating an internal source voltage $IV_{CC}$ necessary to drive each of internal circuits in the semiconductor device, a booster circuit provided between the internal source voltage $IV_{CC}$ and the ground voltage $V_{SS}$, for generating a boosted voltage $V_{BST}$ higher than the internal source voltage $IV_{CC}$, and a capacitor provided between the boosted voltage $V_{BST}$ and the ground voltage, for stabilizing the boosted voltage $V_{BST}$. The capacitor comprises a P type semiconductor substrate to which the ground voltage is applied, and an N type well region having therein a P type well region with a memory cell formed therein and to which the internal source voltage $IV_{CC}$ is applied.

8 Claims, 6 Drawing Sheets

Fig. 6

SEMICONDUCTOR DEVICE

BACKGROUND OF THE INVENTION

1. Field of the Invention

The present invention relates to a semiconductor device capable of providing more stabilization of a voltage for operating an internal circuit based on a source voltage supplied from outside the semiconductor device and reducing a chip area.

2. Description of the Related Art

An internal source voltage has heretofore been generated by an internal source voltage generating circuit (step-down or debooster circuit or the like) provided inside a semiconductor device, based on an external source voltage supplied by a constant voltage source from outside the semiconductor device. Further, a boosted voltage higher than the internal source voltage has been generated by a booster circuit based on the internal source voltage. These internal source voltage and boosted voltage have been used to drive an internal circuit (such as a memory cell, TTL (Transistor Transistor Logic) level input buffer circuit, a data output driver circuit) employed in the semiconductor device.

In the above-described semiconductor device, however, there may be cases in which when current is consumed by the internal circuit in the semiconductor device where the internal circuit is operated using the aforementioned internal source voltage and boosted voltage, a voltage drop is developed due to the impedance of the internal source voltage generating circuit, so that the internal source voltage and boosted voltage change. Thus, there has been provided a capacitor for voltage stabilization between a node placed between the internal source voltage generating circuit and the internal circuit and a ground voltage with a view toward stabilizing the internal source voltage and the boosted voltage. A capacitor having a MOS type structure wherein a gate oxide film used for a MOS (Metal Oxide Semiconductor) transistor is used as an insulator, has been used as such a capacitor. In the capacitor having such a MOS type structure, a gate electrode thereof is electrically connected to a node provided between an internal source voltage generating circuit and an internal circuit, and a source and drain thereof are both electrically connected to a ground voltage. On the other hand, since different driving source voltages are respectively applied to an N type well for each memory cell and an N type well for a peripheral circuit, both the N type wells have physically been separated from each other.

SUMMARY OF THE INVENTION

An object of the present invention is to provide a semiconductor device capable of improving the stabilization of an internal source voltage employed in the semiconductor device while controlling an increase in the area of a chip employed in the semiconductor device.

In order to achieve the above object, there is provided a semiconductor device according to the present invention, comprising a debooster circuit for generating an internal source voltage lower than an external source voltage, based on the external source voltage inside the semiconductor device, a booster circuit for generating a boosted voltage higher than the internal source voltage, based on the internal source voltage, a first conduction type semiconductor substrate supplied with a ground voltage, a second conduction type first well region formed within the semiconductor substrate and supplied with the boosted voltage, a first conduction type second well region formed within the first well region, and memory cells formed over the second well region.

Further, in order to achieve the above object, there is provided a semiconductor device according to the present invention, comprising a debooster circuit for generating an internal source voltage lower than an external source voltage, based on the external source voltage inside the semiconductor device, a booster circuit for generating a boosted voltage higher than the internal source voltage, based on the internal source voltage, a first conduction type semiconductor substrate supplied with a ground voltage, a second conduction type first well region formed within the semiconductor substrate and supplied with the boosted voltage, a first conduction type second well region formed within the first well region, memory cells formed over the second well region, a first conduction type third well region formed within the first well region and supplied with the ground voltage, and peripheral circuits formed over the first and third well regions and disposed on the periphery of each memory cell.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Preferred embodiments of the present invention will hereinafter be described with reference to the accompanying drawings.

Figure 1:
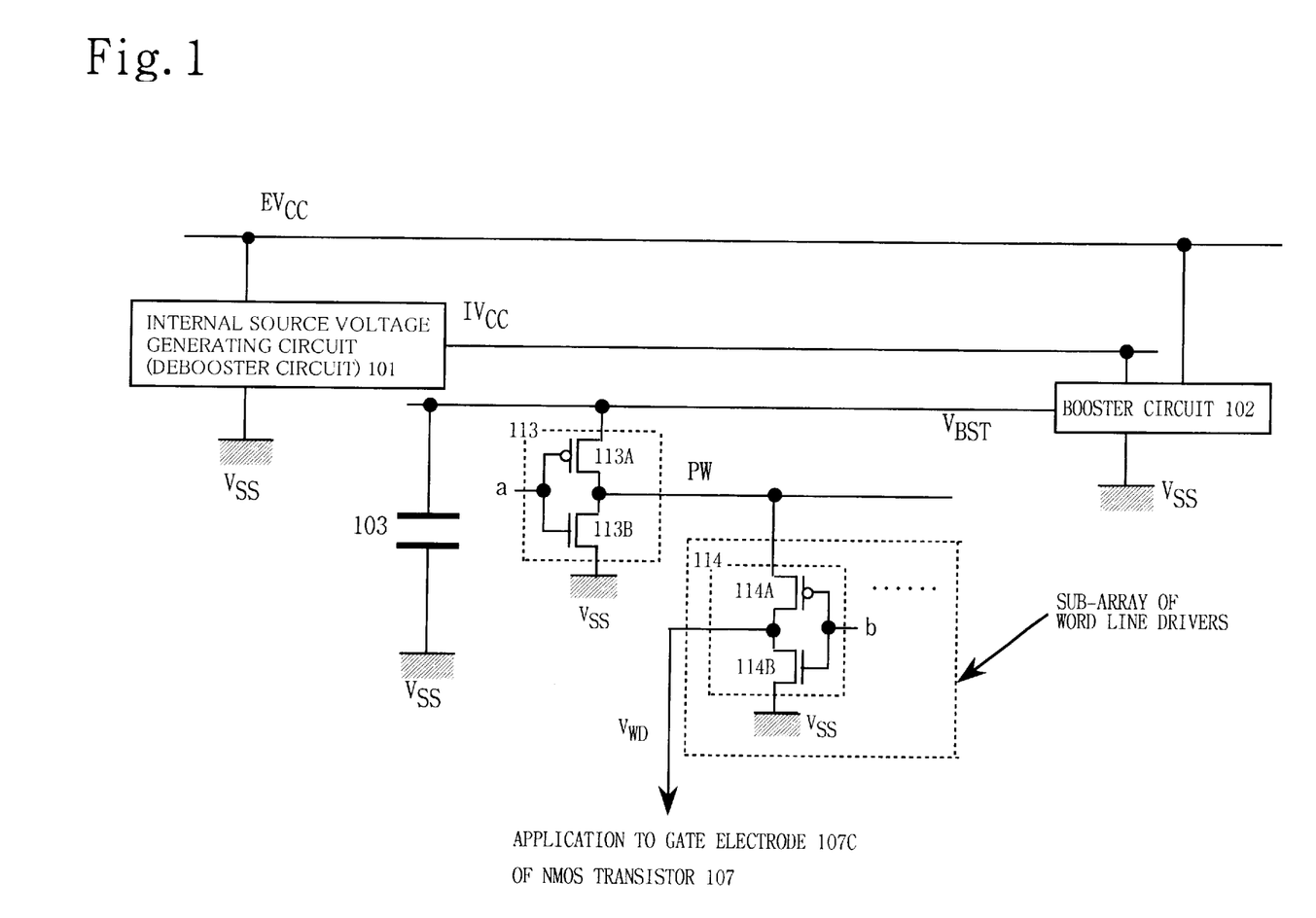
FIG. 1 is a semiconductor integrated circuit diagram showing a first embodiment of the present invention.

FIG. 1 is a semiconductor integrated circuit diagram showing a first embodiment of the present invention.

Referring to FIG. 1, an internal source voltage generating circuit (step-down or debooster circuit) 101 for generating an internal source voltage $IV_{CC}$ necessary to drive each of internal circuits in a semiconductor device is electrically connected between an external source voltage $EV_{CC}$ and a ground voltage $V_{SS}$. Further, a booster circuit 102 for generating a boosted voltage $V_{BST}$ higher than the internal source voltage $IV_{CC}$ is electrically connected between the external source voltage $EV_{CC}$ and internal source voltage $IV_{CC}$ and the ground voltage $V_{SS}$. A capacitor 103 for stabilizing the boosted voltage $V_{BST}$ is electrically connected between the boosted voltage $V_{BST}$ and the ground voltage $V_{SS}$. As will be described later, the capacitor 103 comprises a P type semiconductor substrate 104 to which the ground voltage $V_{SS}$ is applied, and an N type well region 105 to which the boosted voltage $V_{BST}$ is applied. The N type well region 105 has a P type well region 106A in which a memory cell 109 is formed, and a P type well region 106B in which an N channel type MOS transistor (hereinafter called "NMOS transistor") 114B for each word line driver is formed.

Further, the boosted voltage $V_{BST}$ is also used as a source voltage for a circuit 113 for generating a driving source voltage used for each word line driver, which circuit comprises an inverter. The word-line driver driving source voltage generating circuit 113 is comprised of a P channel type MOS transistor (hereinafter called "PMOS transistor") 113A and an NMOS transistor 113B and outputs an output voltage PW therefrom according to the input of a decode signal a to gate electrodes of the PMO transistor 113A and NMOS transistor 113B.

The output voltage PW is used as a source voltage for a word line driver 114 comprised of an inverter. The word line driver 114 comprises a PMOS transistor 114A and an NMOS transistor 114B. A plurality of word line drivers are electrically connected to an output signal line of one word-line driver driving source voltage generating circuit 113. A sub-array for the word line drivers is comprised of the plurality of word line drivers 114. Each word line driver 114 outputs a word line driving source voltage $V_{WD}$ according to the input of a decode signal b to gate electrodes of the PMOS transistor 114A and NMOS transistor 114B. The word line driving source voltage $V_{WD}$ is applied to a gate electrode 107C of an NMOS transistor 107 provided within the memory cell 109 to be described later.

Figure 2:
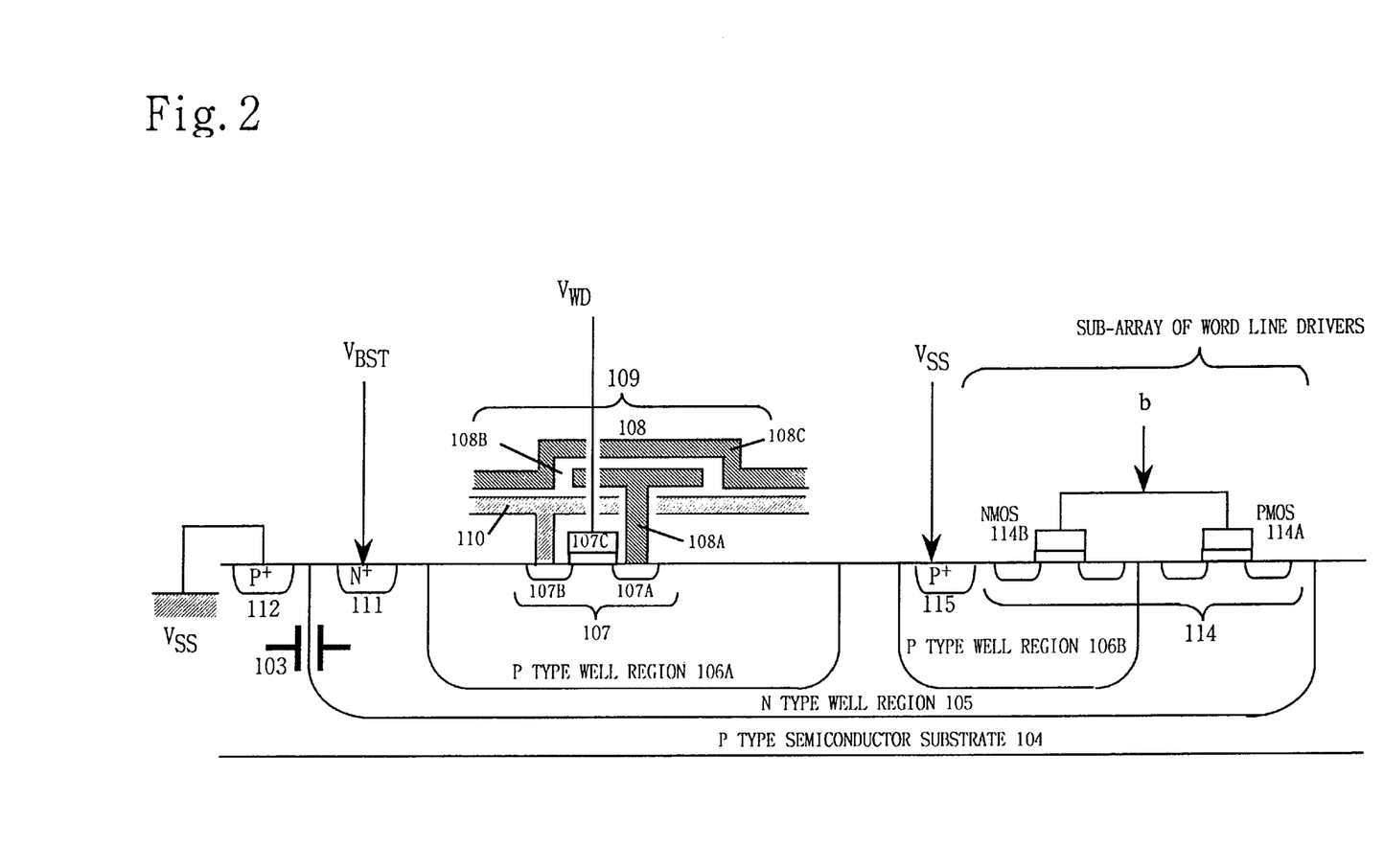
FIG. 2 is a device structure cross-sectional view illustrating a capacitor, a memory cell and word line drivers used for stabilizing an internal source voltage in the semiconductor device according to the first embodiment of the present invention.

FIG. 2 is a device structure cross-sectional view showing a capacitor, a memory cell and word line drivers used for stabilizing an internal source voltage in the semiconductor device according to the first embodiment of the present invention. In the first embodiment, a well region formed within a semiconductor substrate is used to form the capacitor for stabilizing the level of the internal source voltage generated inside the semiconductor device. Further, the same voltage is applied to an N type well region for a memory cell array and an N type well used for a sub-array of word line drivers so as to be formed as an N type well region common to the memory cell array and the sub-array of the word line drivers.

An N type well region 105 comprised of a conduction type diffused layer region different from a P type semiconductor substrate 104 is formed within the semiconductor substrate 104. P type well regions 106A and 106B each comprised of a diffused layer region of the same conduction type as the semiconductor substrate 104 are formed within the N type well region 105. A ground voltage $V_{SS}$ is applied to the P type semiconductor substrate 104 as a back bias voltage through a P type high-concentration impurity layer 112.

An NMOS transistor 107 comprised of N type high-concentration impurity layers 107A and 107B serving as a source and a drain respectively and a gate electrode 107C is formed within the P type well region 106A. Further, a lower electrode 108A of a capacitor 108 is electrically connected to the N type high-concentration impurity layer 107A. The capacitor 108 comprises the lower electrode 108A, a dielectric film 108B and an upper electrode 108C. Further, the NMOS transistor 107 and the capacitor 108 constitute one memory cell 109. A bit line 110 for reading data stored in each memory cell or transmitting data upon writing of data therein is electrically connected to the N type high-concentration impurity layer 107B.

The P type well region 106A is used as a memory cell array, for example. The memory cell array is comprised of a plurality of the memory cells 109 disposed in matrix form. On the other hand, an N type high-concentration impurity layer 111 is formed within the N type well region 105. A boosted voltage $V_{BST}$ generated from a booster circuit 102 is applied to the N type high-concentration impurity layer 111.

Further, a word line driver 114 comprises a PMOS transistor 114A formed within the N type well region 105, and an NMOS transistor 114B formed in the P type well region 106B. A P type high-concentration impurity region 115 is formed within the P type well region 106B. The ground voltage $V_{SS}$ is applied to the P type well region 106B through the P type high-concentration impurity region 115. Such word line driver 114 is arranged in plural form so that the sub-array of the word line drivers is constructed as described above.

Operation and effects related to the semiconductor device according to the first embodiment of the present invention will next be described.

An internal source voltage $IV_{CC}$ is generated based on an external source voltage $EV_{CC}$ from the internal source voltage generating circuit (debooster circuit) 101. The booster circuit 102 outputs a boosted voltage $V_{BST}$, based on the internal source voltage $IV_{CC}$ and the external source voltage $EV_{CC}$. When a decode signal a having an "L" level is inputted to the word-line driver driving source voltage generating circuit 113 at this time, the PMOS transistor 113A is brought into conduction and the NMOS transistor 113B is brought into nonconduction. Therefore, an output voltage PW based on the boosted voltage $V_{BST}$ is outputted from an output terminal of the word-line driver driving source voltage generating circuit 113. Thereafter, when a decode signal b, which is "L" in level, is inputted to the word line driver 114, the PMOS transistor 114A is brought into conduction and the NMOS transistor 114B is brought into nonconduction, so that a word line driving source voltage $V_{WD}$ is outputted from an output terminal of the word line driver 114. The word line driving source voltage $V_{WD}$ is applied to the gate electrode 107C of the NMOS transistor 107 so that the corresponding memory cell 109 is selected. Now, a plurality of memory cells are electrically connected to one word line, and a word line driving source voltage $V_{WD}$ enough to be able to bring NMOS transistors lying within these memory cells into conduction is required. When one word line is selected at this time, the boosted voltage $V_{BST}$ will drop.

In the first embodiment of the present invention, however, the boosted voltage $V_{BST}$ is applied to the N type high-concentration impurity region 111 lying within the N type well region 105 and the ground voltage $V_{SS}$ is applied to the P type high-concentration impurity region 112 lying within the P type semiconductor substrate 104. Therefore, the N type well region 105 is higher than the P type semiconductor substrate 104 in potential level. As a result, a depletion layer is developed in a PN junction formed between the P type semiconductor substrate 104 and the N type well region 105. Thus, a capacitor 103 for stabilizing the boosted voltage $V_{BST}$ is formed between the booster circuit 102 and the ground voltage $V_{SS}$ by means of the P type semiconductor substrate 104 and the N type well region 105.

In the semiconductor device, the proportion of a memory cell array in the area of a semiconductor chip is generally increased to about 50%. Accordingly, the area of the N type well region 105, which surrounds the P type well region 106A in which the memory cell array is formed, becomes also large. Since the P type semiconductor substrate 104 and N type well region 105 sufficiently large in area are used as components for the capacitor 103 for stabilization of the boosted voltage $V_{BST}$, it is not necessary to additionally ensure a region for forming the capacitor for stabilization of the boosted voltage $V_{BST}$ within a semiconductor chip region. As a result, the boosted voltage $V_{BST}$ can be stabilized more effectively while the increase in the area of the semiconductor chip is being controlled. Since the level of the word line driving source voltage $V_{WD}$ is also stabilized if the level of the boosted voltage $V_{BST}$ can be stabilized in this way, the writing of data into each memory cell can be carried out at high-speed operation.

In the first embodiment of the present invention, the boosted voltage $V_{BST}$ is applied to the N type well region for the memory cell array and the N type well region for the sub-array of the word line drivers. It is thus unnecessary to physically separate the N type well region for the memory cell array from the N type well region for the sub-array of the word line drivers. Further, the memory cell array and the sub-array for the word line drivers can be formed within the same N type well region 105. It is therefore possible to reduce the area of the chip employed in the semiconductor device.

Figure 3:
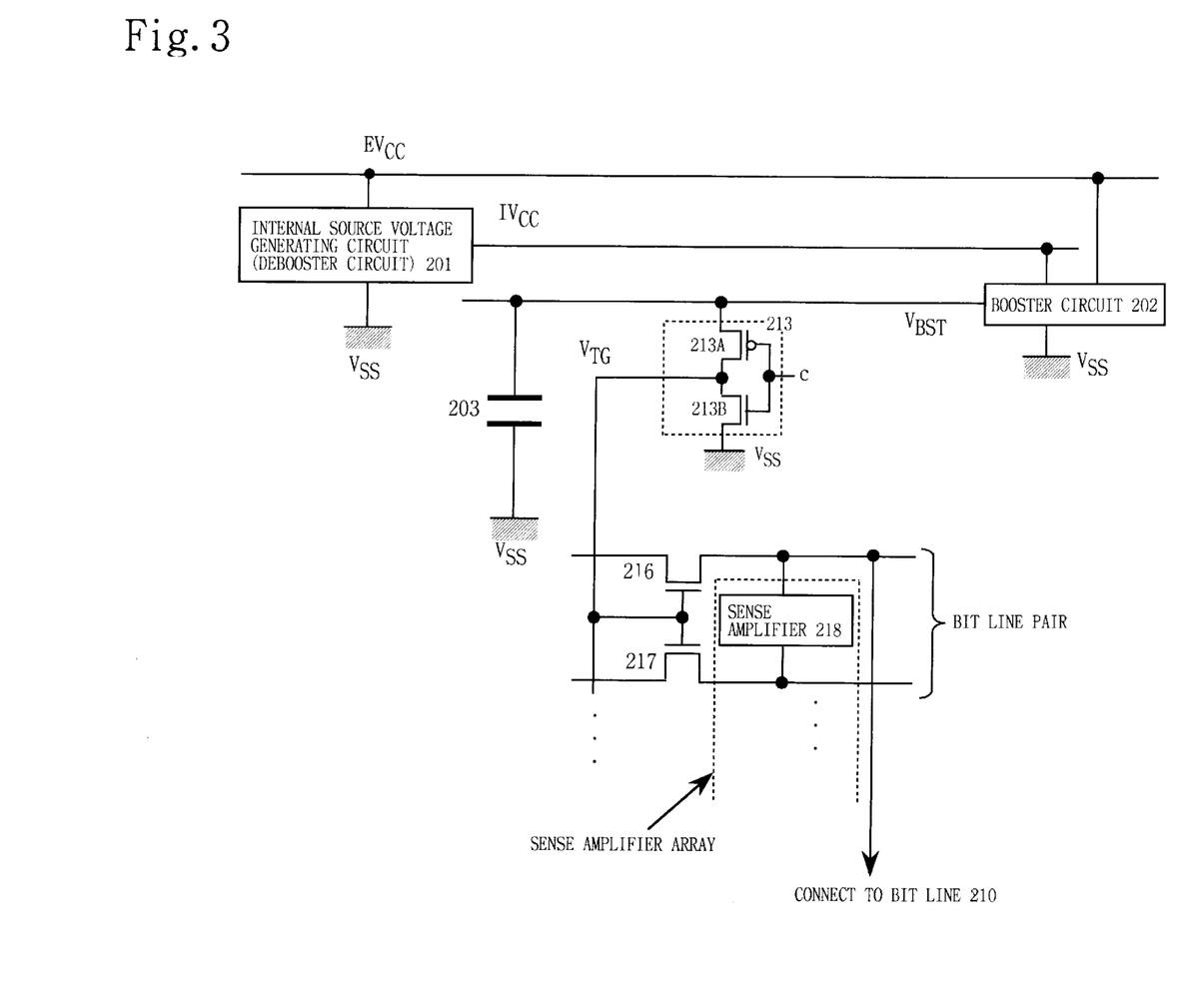
FIG. 3 is a semiconductor integrated circuit diagram showing a second embodiment of the present invention.

FIG. 3 is a semiconductor integrated circuit diagram showing a second embodiment of the present invention.

Referring to FIG. 3, an internal source voltage generating circuit (step-down or debooster circuit) 201 for generating an internal source voltage $IV_{CC}$ necessary to drive each of internal circuits in a semiconductor device is electrically connected between an external source voltage $EV_{CC}$ and a ground voltage $V_{SS}$. Further, a booster circuit 202 for generating a boosted voltage $V_{BST}$ higher than the internal source voltage $IV_{CC}$ is electrically connected between the external source voltage $EV_{CC}$ and internal source voltage $IV_{CC}$ and the ground voltage $V_{SS}$. A capacitor 203 for stabilizing the boosted voltage $V_{BST}$ is electrically connected between the boosted voltage $V_{BST}$ and the ground voltage $V_{SS}$. As will be described later, the capacitor 203 comprises a P type semiconductor substrate 204 to which the ground voltage $V_{SS}$ is applied, and an N type well region 205 to which the boosted voltage $V_{BST}$ is applied. The N type well region 205 has a P type well region 206A in which a memory cell 209 is formed, and a P type well region 206B in which an NMOS transistor 218B for each sense amplifier array is formed.

Further, the boosted voltage $V_{BST}$ is also used as a source voltage for a circuit 213 for generating a driving source voltage used for bit line selection, which circuit comprises an inverter. The bit-line selecting drive source voltage generating circuit s is comprised of a PMOS transistor 213A and an NMOS transistor 213B and outputs a driving source voltage $V_{TG}$ for bit line selection therefrom according to the input of a decode signal c to gate electrodes of the PMO transistor 213A and NMOS transistor 213B.

The driving source voltage $V_{TG}$ for the bit line selection is applied to gate electrodes of NMOS transistors 216 and 217, which serve row selection gates connected to bit line pairs respectively. Further, a plurality of the bit line pairs are electrically connected to a signal line for transferring the driving source voltage $V_{TG}$ for the bit line selection. Furthermore, sense amplifiers 218 are respectively electrically connected between the adjacent bit line pairs. The plurality of sense amplifiers 218 are disposed in matrix form so as to constitute the sense amplifier array. One bit line of the bit line pair serves as a bit line 210 of a memory cell 209 to be described later.

Figure 4:
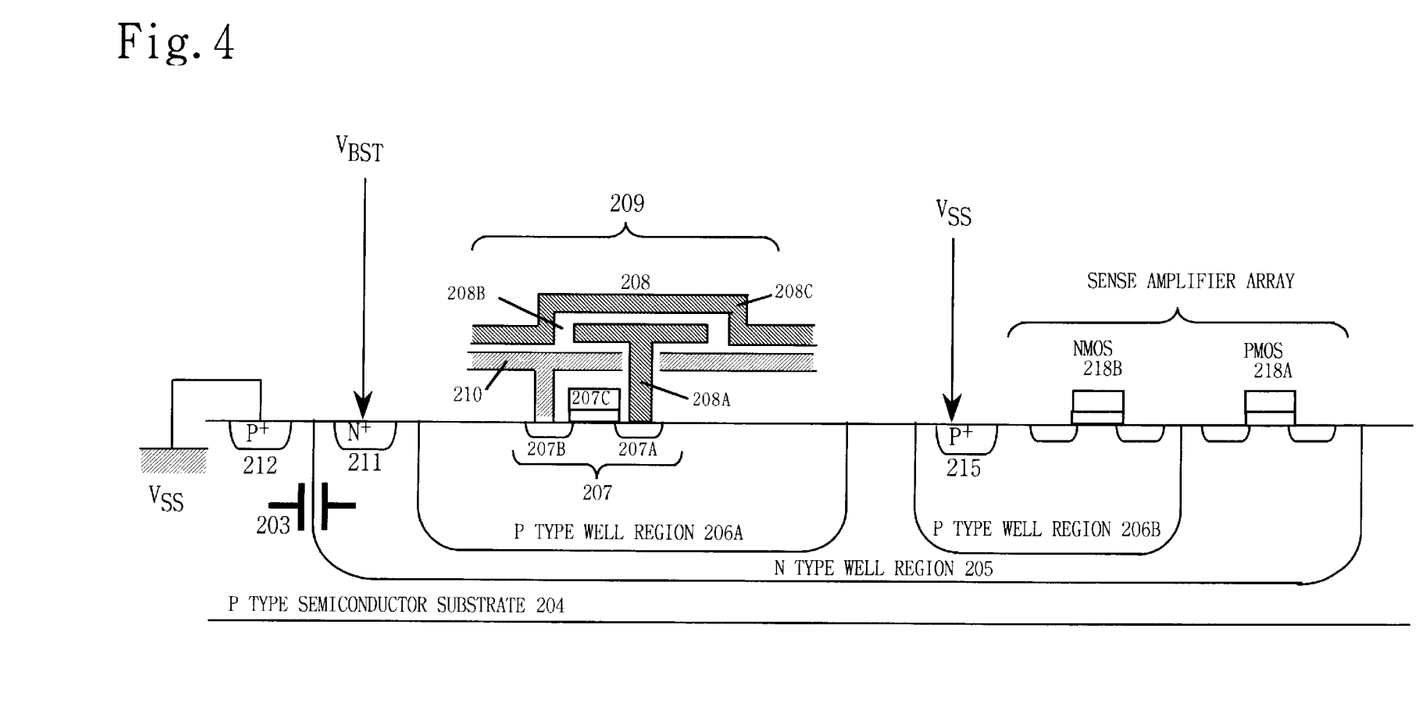
FIG. 4 is a device structure cross-sectional view illustrating a capacitor, a memory cell and a sense amplifier array used for stabilizing an internal source voltage in the semiconductor device according to the second embodiment of the present invention.

FIG. 4 is a device structure cross-sectional view showing a capacitor, a memory cell and a sense amplifier array used for stabilizing an internal source voltage in the semiconductor device according to the second embodiment of the present invention. In the second embodiment, a semiconductor substrate and a well region formed within the semiconductor substrate are used to form the capacitor for stabilizing the level of the internal source voltage generated inside the semiconductor device. Further, the same voltage is applied to an N type well region for a memory cell array and an N type well for the sense amplifier array so as to be used as a common N type well region.

An N type well region 205 comprised of a conduction type diffused layer region different from a P type semiconductor substrate 204 is formed within the semiconductor substrate 204. P type well regions 206A and 206B each comprised of a diffused layer region of the same conduction type as the semiconductor substrate 204 are formed within the N type well region 205. A ground voltage $V_{SS}$ is applied to the P type semiconductor substrate 204 as a back bias voltage through a P type high-concentration impurity layer 212.

An NMOS transistor 207 comprised of N type high-concentration impurity layers 207A and 207B serving as a source and a drain respectively and a gate electrode 207C is formed within the P type well region 206A. Further, a lower electrode 208A of a capacitor 208 is electrically connected to the N type high-concentration impurity layer 207A. The capacitor 208 comprises the lower electrode 208A, a dielectric film 208B and an upper electrode 208C. Further, the NMOS transistor 207 and the capacitor 208 constitute one memory cell 209. A bit line 210 for reading data stored in each memory cell or transmitting data upon writing of data therein is electrically connected to the N type high-concentration impurity layer 207B. The P type well region 206A is used as a memory cell array, for example. The memory cell array is comprised of a plurality of the memory cells 209 disposed in matrix form. On the other hand, an N type high-concentration impurity layer 211 is formed within the N type well region 205. A boosted voltage $V_{BST}$ generated from a booster circuit 202 is applied to the N type high-concentration impurity layer 211.

Further, each sense amplifier 218 comprises a plurality of PMOS transistors 218A formed within the N type well region 205, and a plurality of NMOS transistors 218B formed in the P type well region 206B. A P type high-concentration impurity region 215 is formed within the P type well region 206B. The ground voltage $V_{SS}$ is applied to the P type well region 206B through the P type high-concentration impurity region 215. Such a sense amplifier 218 is arranged in plural form so that the sense amplifier array is constructed as described above.

Operation and effects related to the semiconductor device according to the second embodiment of the present invention will next be described.

An internal source voltage $IV_{CC}$ is generated based on an external source voltage $EV_{CC}$ from the internal source voltage generating circuit (debooster circuit) 201. The booster circuit 202 outputs a boosted voltage $V_{BST}$, based on the internal source voltage $IV_{CC}$. When a decode signal c having an "L" level is inputted to the bit-line selecting drive source voltage generating circuit 213 for each bit line at this time, the PMOS transistor 213A is brought into conduction and the NMOS transistor 213B is brought into non-conduction. Therefore, a driving source voltage $V_{TG}$ for bit line selection is outputted from an output terminal of the bitline selecting drive source voltage generating circuit 213. The driving source voltage $V_{TG}$ is applied to the gate electrodes of the NMOS transistors 216 and 217, which serve as the row selection gates provided for each bit line pair, so that data stored in each memory cell 209, which has been amplified by the corresponding sense amplifier 218, is read. Here, a plurality of the row selection gates are electrically connected to one wire or interconnection for transferring the driving source voltage $V_{TG}$, and a driving source voltage $V_{TG}$ for bit line selection enough to be able to bring these row selection gates (NMOS transistors) into conduction is required. When the driving source voltage $V_{TG}$ for bit line selection is applied to one interconnection for transferring the driving source voltage $V_{TG}$ at this time, the boosted voltage $V_{BST}$ will drop.

In the second embodiment of the present invention, however, the boosted voltage $V_{BST}$ is applied to the N type high-concentration impurity region 211 lying within the N type well region 205, and the ground voltage $V_{SS}$ is applied to the P type high-concentration impurity region 212 lying within the P type semiconductor substrate 204. Therefore, the N type well region 205 is higher than the P type semiconductor substrate 204 in potential level. As a result, a depletion layer is developed in a PN junction formed between the P type semiconductor substrate 204 and the N type well region 205. Thus, a capacitor 203 for stabilizing the boosted voltage $V_{BST}$ is formed between the booster circuit 202 and the ground voltage $V_{SS}$ by means of the P type semiconductor substrate 204 and the N type well region 205.

In the semiconductor device, the proportion of each memory cell array in the area of a semiconductor chip generally reaches a high percentage of about 50. Accordingly, the area of the N type well region 205, which surrounds the P type well region 206A in which the memory cell array is formed, becomes also large. Since the P type semiconductor substrate 204 and N type well region 205 sufficiently large in area are used as components for the capacitor 203 for stabilization of the boosted voltage $V_{BST}$, it is not necessary to additionally ensure a region for forming the capacitor for stabilization of the boosted voltage $V_{BST}$ within a semiconductor chip region. As a result, the boosted voltage $V_{BST}$ can be stabilized more effectively while the increase in the area of the semiconductor chip is being controlled. Since the level of the driving source voltage $V_{WD}$ for the bit line selection is also stabilized if the level of the boosted voltage $V_{BST}$ can be stabilized in this way, the reading of data from each memory cell and writing of data therein can be carried out at high-speed operation.

In the second embodiment of the present invention, the boosted voltage $V_{BST}$ is applied to the N type well region for the memory cell array and the N type well region for the sub-array of the word line drivers. It is thus unnecessary to physically separate the N type well region for the memory cell array from the N type well region for the sense amplifier array. Further, the memory cell array and the sense amplifier array can be formed within the same N type well region 205. It is therefore possible to reduce the area of the chip employed in the semiconductor device.

Figure 5:
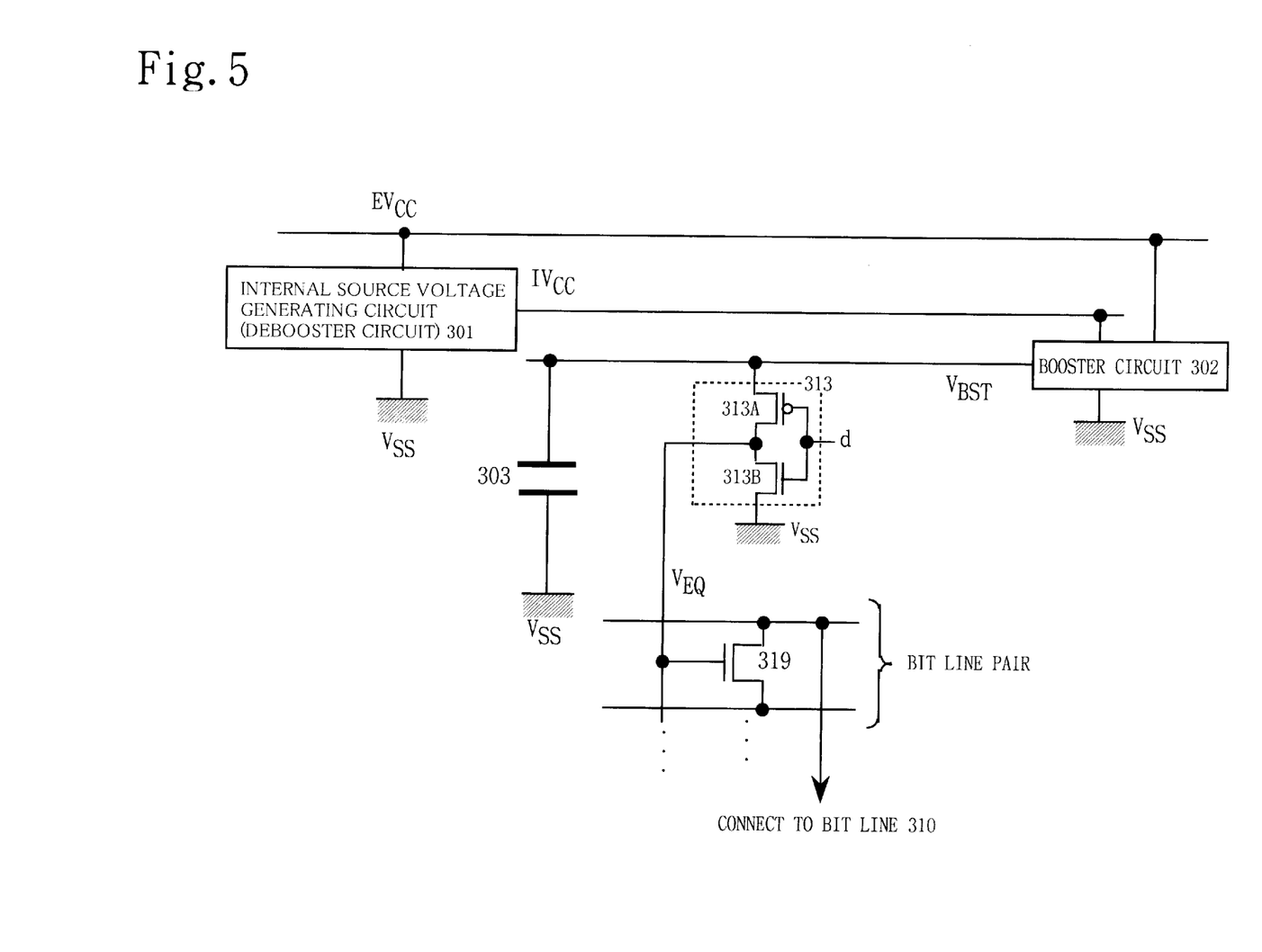
FIG. 5 is a semiconductor integrated circuit diagram showing a third embodiment of the present invention.

FIG. 5 is a semiconductor integrated circuit diagram showing a third embodiment of the present invention.

Referring to FIG. 5, an internal source voltage generating circuit (step-down or debooster circuit) 301 for generating an internal source voltage $IV_{CC}$ required to drive each of internal circuits in a semiconductor device is electrically connected between an external source voltage $EV_{CC}$ and a ground voltage $V_{SS}$. Further, a booster circuit 302 for generating a boosted voltage $V_{BST}$ higher than the internal source voltage $IV_{CC}$ is electrically connected, between the external source voltage $EV_{CC}$ and internal source voltage $IV_{CC}$ and the ground voltage $V_{SS}$. A capacitor 303 for stabilizing the boosted voltage $V_{BST}$ is electrically connected between the boosted voltage $V_{BST}$ and the ground voltage $V_{SS}$. As will be described later, the capacitor 303 comprises a P type semiconductor substrate 304 to which the ground voltage $V_{SS}$ is applied, and an N type well region 305 to which the boosted voltage $V_{BST}$ is applied.

Here, the N type well region 305 has a P type well region 306 in which a memory cell 309 is formed. The boosted voltage $V_{BST}$ is also used as a source voltage for an equalizer driving source voltage generating circuit 313 comprised of an inverter. The equalizer driving source voltage generating circuit 313 is comprised of a PMOS transistor 313A and an NMOS transistor 313B and outputs an equalizer driving source voltage $V_{EQ}$ therefrom according to the input of a decode signal d to gate electrodes of the PMOS transistors 313A and NMOS transistor 313B.

The equalizer driving source voltage $V_{EQ}$ is applied to a gate electrode of each NMOS transistor 319 used as an equalizer. The NMOS transistor 319 is electrically connected between each bit line pair. Since the bit line pair exists in plural form, a plurality of the NMOS transistors (equalizers) are electrically connected to one interconnection for transferring the equalizer driving source voltage $V_{EQ}$. One bit line of each bit line pair serves as a bit line 310 of each memory cell 309.

Figure 6:
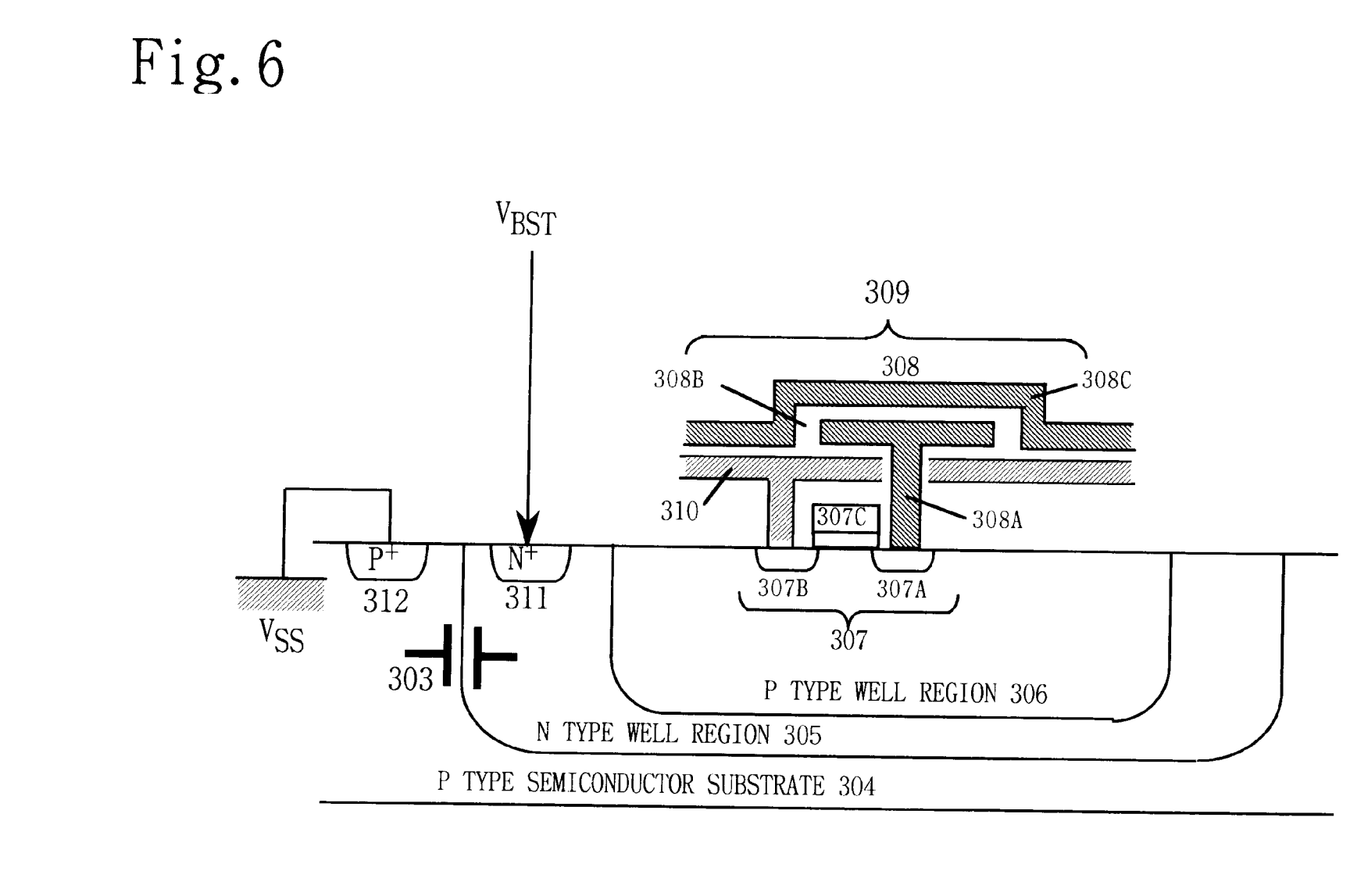
FIG. 6 is a device structure cross-sectional view illustrating a capacitor and a memory cell used for stabilizing an internal source voltage in the semiconductor device according to the third embodiment of the present invention.

FIG. 6 is a device structure cross-sectional view showing a capacitor and a memory cell used for stabilizing an internal source voltage in the semiconductor device according to the third embodiment of the present invention. In the fourth embodiment, a semiconductor substrate and a well region formed in the semiconductor substrate are utilized to thereby constitute a capacitor for stabilizing the level of the internal source voltage generated inside the semiconductor device.

An N type well region 305 comprised of a conduction type diffused layer region different from a P type semiconductor substrate 304 is formed within the semiconductor substrate 304. A P type well region 306 comprised of a diffused layer region of the same conduction type as the semiconductor substrate 304 is formed within the N type well region 305. A ground voltage $V_{SS}$ is applied to the P type semiconductor substrate 304 as a back bias voltage through a P type high-concentration impurity layer 312.

An NMOS transistor 307 comprised of N type high-concentration impurity layers 307A and 307B serving as a source and a drain respectively and a gate electrode 307C is formed within the P type well region 306. Further, a lower electrode 308A of a capacitor 308 is electrically connected to the N type high-concentration impurity layer 307A. The capacitor 308 comprises the lower electrode 308A, a dielectric film 308B and an upper electrode 308C. Further, the NMOS transistor 307 and the capacitor 308 constitute one memory cell 309. A bit line 310 for reading data stored in each memory cell or transmitting data upon writing of data therein is electrically connected to the N type high-concentration impurity layer 307B.

The P type well region 306 is used as a memory cell array, for example. The memory cell array is comprised of a plurality of the memory cells 309 arranged in matrix form. On the other hand, an N type high-concentration impurity layer 311 is formed within the N type well region 305. A boosted voltage $V_{BST}$ generated from a booster circuit 302 is applied to the N type high-concentration impurity layer 311.

Operation and effects related to the semiconductor device according to the third embodiment of the present invention will next be described.

An internal source voltage $IV_{CC}$ is generated based on an external source voltage $EV_{CC}$ from the internal source voltage generating circuit (debooster circuit) 301. The booster circuit 302 outputs a boosted voltage $V_{BST}$ based on the internal source voltage $IV_{CC}$. When a decode signal d having an "L" level is inputted to the equalizer driving source voltage generating circuit 313 at this time, the PMOS transistor 313A is brought into conduction and the NMOS transistor 313B is brought into non-conduction. Therefore, an equalizer driving source voltage $V_{EQ}$ is outputted from an output terminal of the equalizer driving source voltage generating circuit 313. When the equalizer driving source voltage $V_{EQ}$ is applied to the gate electrode of the NMOS transistor 319 used as the equalizer provided between each bit line pair, the NMOS transistor 319 is brought into conduction, so that two bit lines constituting each bit line pair are brought to the same potential. The operation of precharging each bit line is carried out in this way. When the equalizer driving source voltage $V_{EQ}$ is applied to one interconnection for transferring the equalizer driving source voltage $V_{EQ}$ since the plurality of NMOS transistors (equalizers) are electrically connected to one interconnection referred to above, all the NMOS transistors (equalizers) connected to this interconnection are driven. Namely, the boosted voltage $V_{BST}$ will drop due to power consumption of these plural equalizers.

In the present embodiment, however, the boosted voltage $V_{BST}$ is applied to the N type high-concentration impurity region 311 lying within the N type well region 305, and the ground voltage $V_{SS}$ is applied to the P type high-concentration impurity region 312 lying within the P type semiconductor substrate 304. Therefore, the N type well region 305 is higher than the P type semiconductor substrate 304 in potential level. As a result, a depletion layer is developed in a PN junction formed between the P type semiconductor substrate 304 and the N type well region 305. Thus, the capacitor 303 for stabilizing the boosted voltage $V_{BST}$ is formed between the booster circuit 302 and the ground voltage $V_{SS}$ by means of the P type semiconductor substrate 304 and the N type well region 305.

In the semiconductor device, the proportion of each memory cell array in the area of a semiconductor chip generally reaches a high percentage of about 50. Accordingly, the area of the N type well region 305, which surrounds the P type well region 306 in which the memory cell array is formed, becomes also large Since the P type semiconductor substrate 304 and N type well region 305 sufficiently large in area are used as components for the capacitor 303 for stabilization of the boosted voltage $V_{BST}$, it is not necessary to additionally ensure a region for forming the capacitor for stabilization of the boosted voltage $V_{BST}$ within a semiconductor chip region. As a result, the boosted voltage $V_{BST}$ can be stabilized more effectively while the increase in the area of the semiconductor chip is being controlled. Since the level of the equalizer driving source voltage $V_{EQ}$ is also stabilized if the level of the boosted voltage $V_{BST}$ can be stabilized in this way, the precharge of each bit line pair can be carried out at high-speed operation.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
    a debooster circuit that generates an internal source voltage lower than an external source voltage, based on the external source voltage inside the semiconductor device;
    a booster circuit that generates a boosted voltage higher than the internal source voltage, based on the internal source voltage;
    a first conduction type semiconductor substrate supplied with a ground voltage;
    a second conduction type first well region formed within said semiconductor substrate and supplied with the boosted voltage;
    a first conduction type second well region formed within said first well region;
    memory cells formed over said second well region;
    a first conduction type third well region formed within said first well region and supplied with the ground voltage; and
    peripheral circuits formed over said first and third well regions and disposed at a periphery of said memory cells.

2. The semiconductor device as claimed in claim 1, further comprising:
    a word line driving circuit for generating a word line driving source voltage, based on the boosted voltage, and
    wherein transistors provided within said memory cells are controlled by the word line driving source voltage.

3. The semiconductor device as claimed in claim 1, further comprising:
    a bit line selecting drive source voltage generating circuit for generating a bit line selecting source voltage, based on the boosted voltage;
    bit line selecting transistors respectively connected to individual bit line pairs and controlled by the bit line selecting source voltage; and
    sense amplifiers respectively connected between the bit line pairs.

4. The semiconductor device as claimed in claim 1, further comprising:
    an equalizer driving source voltage generating circuit for generating an equalizer driving source voltage, based on the boosted voltage; and
    equalizer circuits each connected between bit line pairs and controlled when said memory cells are precharged by the equalizer driving source voltage.

5. The semiconductor device as claimed in claim 1, wherein each of said peripheral circuits is a word line driver circuit which generates a word line driving source voltage applied to a gate electrode of transistors lying within said memory cells.

6. The semiconductor device as claimed in claim 1, further comprising:

equalizer circuits each connected between bit line pairs and controlled when said memory cells are precharged by an equalizer driving source voltage, wherein said peripheral circuits include an equalizer driving source voltage generating circuit for generating the equalizer driving source voltage, based on the boosted voltage.

7. A semiconductor device comprising:

a semiconductor substrate having a first conductivity type, supplied with a ground voltage;

an internal source voltage generating circuit on the semiconductor substrate, that receives an external source voltage and generates an internal source voltage lower than the external source voltage;

a booster circuit on the semiconductor substrate, that receives the internal source voltage and generates a boosted voltage higher than the internal source voltage;

a first well region having a second conductivity type formed in the semiconductor substrate, that is supplied with the boosted voltage;

a second well region having the first conductivity type formed in the first well region;

a third well region having the first conductivity type formed in the first well region;

a memory that stores data and includes a first MOS transistor of the second conductivity type, the first MOS transistor being on the second well region and controlled by a word line driving voltage; and a word line driving circuit that generates the word line driving voltage based on the boosted voltage and includes second and third MOS transistors, the second MOS transistor having the second conductivity type and being on the third well region, and the third MOS transistor having the first conductivity type and being on the first well region.

8. A semiconductor device comprising:

a semiconductor substrate having a first conductivity type, supplied with a ground voltage;

an internal source voltage generating circuit on the semiconductor substrate, that receives an external source voltage and generates an internal source voltage lower than the external source voltage;

a booster circuit on the semiconductor substrate, that receives the internal source voltage and generates a boosted voltage higher than the internal source voltage;

a first well region having a second conductivity type formed in the semiconductor substrate, that is supplied with the boosted voltage;

a second well region having the first conductivity type formed in the first well region;

a third well region having the first conductivity type formed in the first well region;

a memory cell that stores data and includes a first MOS transistor of the second conductivity type, the first MOS transistor being on the second well region; and a sense amplifier circuit that amplifies the data stored in the memory cell and includes second and third MOS transistors, the second MOS transistor having the second conductivity type and being on the third well region, and the third MOS transistor having the first conductivity type and being on the first well region.

* * * * *